United States Patent [19]
Uchida

[11] Patent Number: 5,804,027
[45] Date of Patent: Sep. 8, 1998

[54] APPARATUS FOR GENERATING AND UTILIZING MAGNETICALLY NEUTRAL LINE DISCHARGE TYPE PLASMA

[75] Inventor: Taijiro Uchida, Chigasaki, Japan

[73] Assignee: Nihon Shinku Gijutsu Kabushiki Kaisha, Chigasaki, Japan

[21] Appl. No.: 796,568

[22] Filed: Feb. 6, 1997

[30] Foreign Application Priority Data

Feb. 9, 1996 [JP] Japan .................................... 8-023835
Feb. 21, 1996 [JP] Japan .................................... 8-033441

[51] Int. Cl.$^6$ ....................................................... H05H 1/00
[52] U.S. Cl. ............... 156/345; 204/298.16; 204/298.37; 118/723 I
[58] Field of Search .......................... 156/345; 118/723 I, 118/723 IR, 723 E, 723 ER; 204/298.37, 298.16

[56] References Cited

U.S. PATENT DOCUMENTS 5,344,536  9/1994  Obuchi et al. ........................... 156/345

*Primary Examiner*—Thi Dang
*Attorney, Agent, or Firm*—Larson & Taylor

[57] ABSTRACT

An apparatus for generating magnetically neutral line discharge type plasma comprises a magnetic field generating coil for forming magnetically neutral lines defined by continuously connecting points of zero-intensity magnetic field that is arranged within the vacuum chamber so that a couple of lines of magnetic force crossing vertically at the magnetically neutral lines in the perpendicular plane where the center axis is located can be connected by surrounding the magnetic field generating coil without intersecting or touching the lateral wall of the vacuum chamber to reduce any possible loss of plasma and any possible damage to the lateral wall.

As the neutral line discharge type plasma has a capability to generate a well thermalized Maxwellian distribution plasma, an apparatus for generating the magnetically neutral line discharge type plasma is arranged to be utilized to diminish damage of of the lateral wall of the vacuum vessel and to control the electric potential of the plasma to be generated for ion extraction use.

14 Claims, 5 Drawing Sheets

APPARATUS FOR GENERATING AND UTILIZING MAGNETICALLY NEUTRAL LINE DISCHARGE TYPE PLASMA

BACKGROUND OF THE INVENTION

1. Field of the Invention

The present invention relates to an apparatus for generating and utilizing a magnetically neutral line discharge type plasma to be suitably used for conducting a processing operation such as coating, etching, sputtering, ashing and CVD on a substrate or some other target of operation.

2. Prior Art

Plasma has been industrially utilized in various fields and may be classified into two general categories. One is thermal plasma including arc-discharge plasma, where the plasma temperature is less than order of electron volt for both electrons and ions and the pressure is substantially equal to or slightly lower than the atmospheric pressure. Thermal plasma is principally used for melting and welding of metals.

The other is non-equilibrium low-density plasma, where the ion temperature is fairly lower than the electron temperature and hence non-equilibrated with each other. The plasma density is also generally much lower than that of thermal plasma. Non-equilibrium low-density plasma is used for various operations of processing semiconductors like as etching, sputtering, ion implantation, coating and ashing.

Non-equilibrium low-density plasma developed so far for plasma processing includes the following;

(1) ECR (electron cyclotron resonance) plasma;
(2) planar magnetron plasma; and
(3) ICP (inductive coupling plasma).

Of these, (1) is accompanied by problems including that plasma electrons show remarkably higher energy in the direction perpendicular to the magnetic field comparing with that in the direction parallel to the magnetic field, resulting in unstable behavior on the part of plasma, a loss of energy due to abnormal oscillations and charge-up damage. (2) cannot get rid of the disadvantage of uneven performance due to the specific profile of the magnet used for generating plasma. While (3) has been used for more than a century as high frequency discharge plasma, the generated plasma appears as bulk that is dense at the center and becomes thinner in peripheral zones with a relatively low degree of ionization and a low plasma density in spite of a high rate of gas introduction. The above description about ICP substantially applies also to microwave discharge plasma.

Plasma to be utilized for processing has to have a Maxwell distribution on the particle energies as far as possible in order to draw out ions from plasma effectually for ion or high neutral particle injections.

T. Uchida who is the inventor of the present invention proposed for the first time in the world a technique of generating plasma by applying an electric field along a magnetically neutral line defined in space by continuously connecting points of zero-intensity magnetic field into a gas introduced to give rime to electric discharge. The proposed technique drew attention among the researchers of the related technological fields because of the advantages of magnetically neutral line discharge type plasma over ICP, popular in the fields by applying a rf oscillating electric field of 13.56 MHz.

The known plasma etching technique consists in generating plasma from chemically active gas under low pressure by means of electric discharge and causing ions, neutral radials and other active particles in the plasma to react with the material of the object to be etched so that the reaction product may be released from the object into the vapor phase of the reaction system. Various types of plasma etching are known to date. For instance, one is a magnetron discharge type in a DC electric field, and another one is an ECR plasma source type by applying a microwave (2.45 Ghz).

Various CVD plasma techniques are also known for producing plasma by RF plasma excitation to release the chemical bonding of reactive gas and forming film through mutual reactions of activated particles of reactive gas.

In many apparatuses that utilizes plasma, there exists an unevenness in the spatial distribution of density and temperature just over the substrate and also in the velocity space due to the accelerated motion of charged particles caused by the electric fields to be applied. Therefore, the substrate to be processed in such apparatuses can be operated empirically and particularly in their respective applications. When they are used for an etching process, not only charged particles but also radicals (chemically active particles) have to be taken into consideration for their behaviors.

As for sputtering, efforts have been paid to enlarge the eroded area of a cathode target by means of plasma moving with mechanical shifting of permanent magnet arranged behind the cathode in order to improve the use up efficiency of target or by improving the profile of magnetic lines of force of permanent magnet used, although the use up efficiency of cathode remains to be a problem that makes the overall apparatus rather complicated or bulky.

In an attempt to solve the problem of conventional plasma apparatus, T. Uchida who is the inventor of the present invention has proposed a discharged plasma processing apparatus for processing an object of treatment in a vacuum chamber, wherein the apparatus comprises a magnetic field generating means for forming magnetically neutral lines in the vacuum chamber and an electric field generating means for generating plasma along the magnetically neutral lines formed by the magnetic yield generating means in the vacuum chamber (Japanese Patent Kokal No.7-90632). The proposed apparatus can regulate the location and the size of the magnetically neutral lines, accordingly, can displace the location of plasma generation simply by controlling the excitation current relative to the magnetic field generating means. Thus, the above previously proposed invention has a dramatic effect on processing operations involving the use of plasma, and became called as NLD (neutral line discharge) plasma thereafter.

However, the magnetically neutral line produced by continuously connecting points of zero-intensity magnetic field is theoretically accompanied by at least four lines of magnetic force that intersect the line. While many of the charged particles of plasma generated by applying an electric field to the magnetically neutral line diffuse freely in space some part of charged particles move along the magnetic lines of force intersecting the magnetically neutral lines. As they move along the lines, a part of them collide with the lateral wall of vacuum chamber and do damage to the wall some times where they become lost.

FIG. 1 of the accompanying drawings schematically illustrates the proposed discharge plasma processing apparatus comprising a vacuum vessel A divided into a plasma generating chamber A1 and a substrate processing chamber A2 and three electromagnetic coils B, C and D arranged outside the plasma generating chamber A1, of which the upper- and lowermost electromagnetic coils B and D are used for allowing an electrical current to generate a magnetic field in a given direction, whereas the middle electromagnetic coil C is used for generation of the reversed directional magnetic field. In FIG. 1, there are also shown a high frequency coil E and a substrate F that is set in the substrate processing chamber A2 and to be processed by plasma generated in the plasma generating chamber A1. With this arrangement, since the middle electromagnetic coil C that is designed to form a magnetically neutral loop line within the plasma generating chamber made of a dielectric material is arranged outside the plasma generating chamber Al, particles directed to the lateral wall of the plasma generating chamber along the two magnetic lines of force intersecting the magnetically neutral lines pass through the plasma generating chamber as 10 shown in FIG. 2 so that charged particles of plasma flowing out along these lines of magnetic force apparently collide with the lateral wall to give rise to a loss of plasma and a damage to the lateral wall.

The present invention is intended to realize an is excellent plasma processing operation that is free from the drawbacks mentioned above on the basis of the advantages of NLD plasma which are: that the magnetic field from the plasma generated by applying an electric field along a magnetically neutral line defined by continuously connecting points of zero magnetic field is directed oppositely above and below the points of zero magnetic field so that no directional asymmetry appear unlike the case of ECR plasma, that the stronger rf power is applied, thermalization of produced is the easier realized, so that the NLD plasma is useful to minimize the risk of charge-up damage owing to energetic elections, that an uniform processing operation can be conducted by controlling the characteristic aspects (including temperature and density) of the generated plasma, the dimensions of the plasma loop and the distance between the plasma loop and the object of treatment and that higher density plasma can be generated under lower gas pressure due to a collision-less heating effect related to the frequency of the applied electric field as compared with IPC when a rf electric field is used. Additionally, the present invention is also intended to realize an excellent plasma processing operation that can draw out ions from plasma by controlling the electric potential of generated plasma, utilizing the phenomena that electrons and ions are apt to move along lines of magnetic force (referred to as separatrix) crossing at points of zero-intensity magnetic field.

Undesired fine particles (particularly of dust) found on the surface of the object to be treated such as wafer has increasingly been providing a serious problem in the field of plasma processing operation, and techniques are being looked for to remove such fine particles. Such particles produced and found on the object to be treated may remain a serious problem even if care is taken to avoid them when the wafer is brought into, transferred or moved out from the processing vessel.

While solid fine particles produced by chemical reactions during the processing operation may inevitably adhere to the surface of the object to be treated, excessively accelerated electrons that are deviated from the Maxwell distribution need to be removed as many as possible because they can give rise to charge-up-damage. NLD plasma is desirable from this viewpoint because it shows always a Maxwell distribution.

NLD plasma La also needed from the viewpoint of generating plasma having a profile good for an appropriate distance from the object to be treated in addition to various desired characteristic aspects (temperature and density) so that the object may be processed not only two-dimensionally but also three-dimensionally.

Finally, a highly paralleled ion flux can be produced by means of -NLD plasma for an etching operation to satisfy rigorous directional requirements. A high speed flux of neutral particles can be prepared by neutralizing the ion flux got out of NLD plasma produced.

In view of these problems, it is therefore an object of the present invention to provide an apparatus for generating a magnetically neutral line discharge type plasma source that is free from such problems.

Another object of the present invention is to provide an apparatus for utilizing a magnetically neutral line discharge type plasma source that is free from such problems.

While either a DC electric field or an AC electric field may be used for the generation of NLD plasma theoretically, an AC is typically used for a looped magnetically neutral line. There are three parameters related to define the characteristics of NLD plasma to be generated. Firstly, an appropriate value has to be assigned to the rate of increase (gradient) of magnetic intensity in all directions from a magnetically neutral line, namely, from points of zero-intensity magnetic field. Secondly, an appropriate frequency has to be selected for a high frequency electric field in correspondence to the appropriate magnetic field. Thirdly, an appropriate intensity has to be determined for the electric field in correspondence to the appropriate gradient of the magnetic field and the appropriate frequency of the high frequency electric field.

Since these three parameters are determined as a function of the type and the pressure of the introduced gas, the collision-less heating effect of the generated plasma that is particularly to NLD plasma can be maximized by selecting appropriate values for them so that plasma having a higher density Maxwell distribution can be generated under lower pressure of a level that any other plasma generating means such as ICP cannot cope with. Additionally, an even plasma distribution can be realized very quickly if the generated plasma is directly used for the processing operation involving the use of plasma required to satisfy specific conditions.

SUMMARY OF THE INVENTION

According to one aspect of the invention, there is provided an apparatus for utilizing magnetically neutral line discharge type plasma comprising a magnetic field generating means for forming a magnetically neutral line defined by continuously and spatially connecting points of zero-intensity magnetic field and an electric field generating means for generating plasma by applying an electric field along the magnetically neutral line to cause the gas therein to breakdown to electric discharge, the generated plasma being sufficiently thermalized to show a Maxwell distribution.

Preferably, the magnetic field generated by the magnetic field generating means is directed oppositely above and below the magnetically neutral line defined by spatially arranged points of zero magnetic field intensity.

According to a second aspect of the invention, there is provided a magnetically neutral line plasma source for generating plasma by utilizing magnetically neutral line discharge in a vacuum chamber, comprising a magnetic field generating means for forming magnetically neutral lines defined by continuously connecting points of zero magnetic field intensity within the vacuum chamber and an electric field generating means for causing the magnetically neutral line in the vacuum chamber to generate plasma by applying an electric field along the magnetically neutral lines, said magnetic field generating means being partly arranged within the vacuum chamber.

In the magnetically neutral line discharge type plasma source the magnetic field generating means may be partly arranged within the vacuum chamber so that two of the four lines of magnetic force crossing at the magnetically neutral lines can be connected each other surrounding the magnetic field generating means.

The magnetic field generating means may comprise a pair of magnetic field generating coils arranged outside the vacuum chamber with an interval and coaxially relative to each other and to the vacuum chamber and a third magnetic field generating coil arranged inside and coaxially relative to the two coils.

For the purpose of the invention, the pair of magnetic field generating coils arranged outside the vacuum chamber with an interval and coaxially relative to each other and to the vacuum chamber of the magnetic field generating means may be replaced by a pair of hollow cylindrical magnets.

The lead wires extending from the wall in the vacuum chamber to the third magnetic field generating coil set inside may affect, if slightly, the generation of plasma when the electromagnetic coil is electrically energized in the vacuum chamber because they break the azimuthal homogeneity of magnetic field.

This problem can be avoided by using a ring of a material that is superconductive at ordinary temperature. With this arrangement, the ring of superconductive material superconductive at ordinary temperature is automatically located at the middle of the upper and lower coils due to the magnetic field pressure when the upper and lower coils are energized by respective electric currents flowing in the same direction to produce respective magnetic fields directed reversely relative to the direction of the magnetic field of the third ring because a magnetic field is constantly formed with the third ring. While the third ring of the superconductive material at ordinary temperature may be located in practice at a position slightly lower than the position where it is supposed to be found, the positional discrepancy may become negligible by selecting a lightweight material for the third ring.

The electric field generating means may comprise a high frequency coil.

As the third coil is arranged within the vacuum chamber, it is necessary to coaxially arrange a high frequency coil between the third coil and the magnetically neutral loop as electric field generating means. However, the arrangement of a high frequency coil in the vacuum chamber can make the overall structure rather complicated and cause the middle coil to be subjected to high frequency electromagnetic induction.

For the purpose of the invention, the electric field generating means may be arranged outside the vacuum chamber and above the plane of the magnetically neutral lines formed in the vacuum chamber when an object of treatment such as wafer is arranged below the magnetically neutral lines.

Japanese Patent Kokai No. 7-90632 discloses a method to avoid unfavorable effect on the parts settled due to high frequency electromagnetic induction by using a double coil structure with an inner conductor coil for the steady-state magnetic field generation current and an outer conductor coil for the high frequency electric current in order to positively exploit the skin effect that an high frequency electric current flows almost outside of conductor coil to be used. For the purpose of the present invention, however, an ingenuous arrangement in required to avoid the effect to the third coil due to a high frequency power source through the vacuum chamber because the former is arranged inside the vacuum chamber.

Japanese Patent Application No. 7-217967 proposes the use of a high frequency coil as electric field generating means arranged not on the plane containing magnetically neutral-lines or in its vicinity but coaxially at an upper or lower position and the present invention utilizes the proposed arrangement of the above invention in such a way that, if an object of treatment such an wafer is arranged below the magnetically neutral loop, a high frequency coil is arranged above the magnetically neutral loop outside the vacuum chamber to urge the object. At the same time, the electric field induced by the high frequency coil is prevented from penetrating into the third coil by covered thin conductive sleeve on the third coil.

According to a third aspect of the invention, there is provided an apparatus for utilizing magnetically neutral line discharge type plasma having a configuration as described above and additionally comprising an electrode means for controlling the potential of the plasma having a Maxwell distribution to generate a high speed ion flux.

Preferably, the electrode means comprises a plasma potential setting electrode for setting the potential of the generated plasma arranged in the vicinity of the formed magnetically neutral line and a high speed ion flux drawing electrode arranged downstream relative to the plasma generating region of the apparatus.

According to a fourth aspect of the invention, there is provided an apparatus for utilizing magnetically neutral line discharge type plasma having a configuration as defined by the third aspect of the present invention and additionally comprising a neutralizing chamber for producing a flux of high speed neutral particles by neutralizing the high speed ion flux from the electrode means arranged downstream relative to the electrode means.

DESCRIPTION OF THE PREFERRED EMBODIMENTS OF THE INVENTION

Now, the present invention will be described by referring to FIGS. 3 to 8 of the accompanying drawings that illustrate preferred embodiments of the invention.

Figure 3:
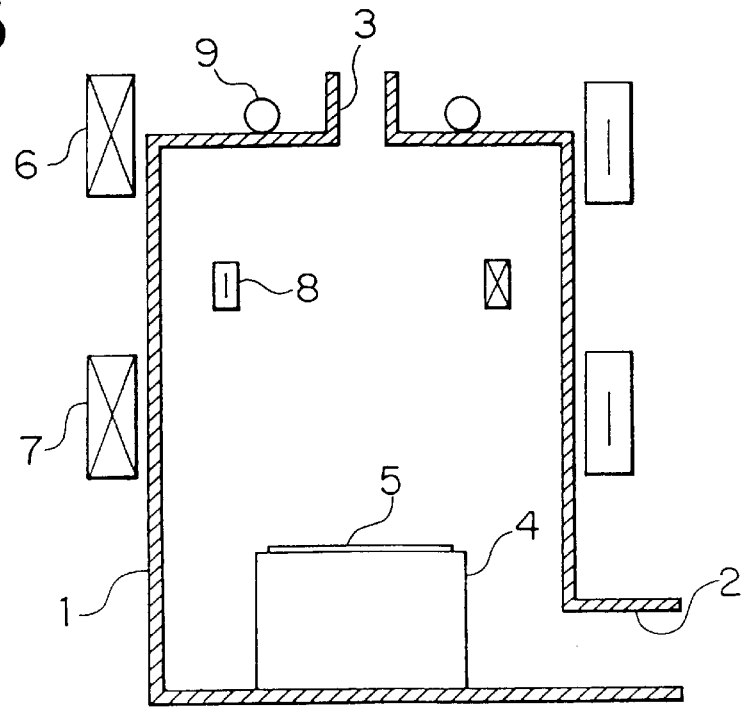
FIG. 3 is a schematic cross sectional view of a first embodiment of the invention, illustrating the underlying principle.

FIG. 3 illustrates the underlying principle of the first embodiment of the present invention. Referring to FIG. 3, it comprises a cylindrical vacuum chamber 1 made of a dielectric material and provided with an exhaust port 2 arranged near the bottom and a gas inlet port 3 arranged at an upper portion thereof for introducing gas to be used in the vacuum chamber. A processing table 4 is arranged in the vacuum chamber 1, carrying thereon an object to be treated 5.

A pair of structurally identical electromagnetic coils 6 and 7 are arranged around the lateral wall of the vacuum chamber 1 and connected in series to a constant current source (not shown). A small electromagnetic coil 8 is arranged inside the vacuum chamber 1 at a level between the electromagnetic coils 6 and 7, supported by three small support rods (not shown) projecting from the inner lateral wall of the vacuum chamber 1 and connected to another constant current source (not shown) located outside the vacuum chamber 1 by way of one of the support rods. A high frequency coil 9 is coaxially arranged outside the vacuum chamber 1 on the top wall thereof and connected to a high frequency power source (not shown) with a frequency of 13.56 MHz.

With the embodiment having a configuration as described above, coaxial magnetically neutral lines are formed inside the electromagnetic coil 8 as the three electromagnetic coils 6, 7 and 8 are excited by respective electric currents from the respective power sources and high frequency discharge plasma is produced of the inside of the magnetically neutral lines by the high frequency coil 9. Note that plasma is constantly generated and produced from the inside of the magnetically neutral lines because of the use of a high frequency wave. The diameter of the coaxial magnetically neutral lines and the distance from the object to be treated 5 can be modified by controlling the electric currents respectively flowing through the upper and lower electromagnetic coils 6 and 7 and the middle electromagnetic coil 8 arranged in the vacuum chamber 1.

Figure 2:
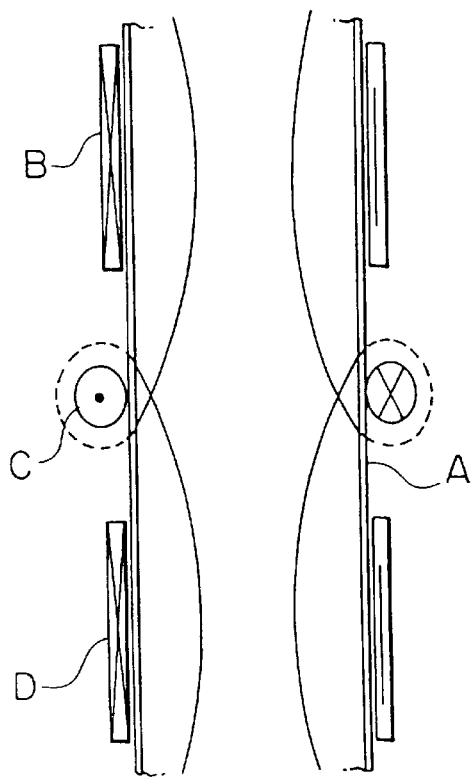
FIG. 2 is an enlarged cross sectional partial view of the apparatus of FIG. 1, illustrating its operation.
Figure 4:
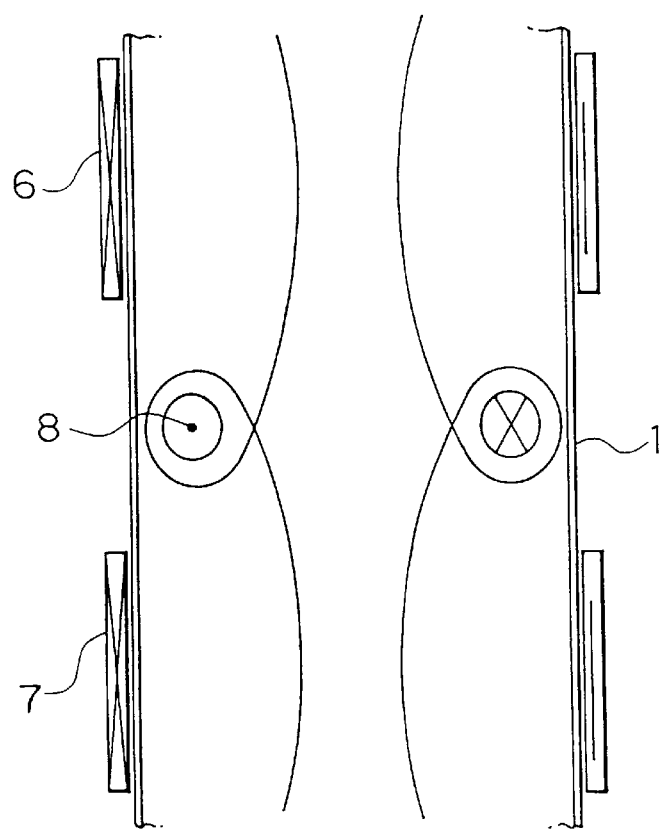
FIG. 4 is an enlarged cross sectional partial view of the embodiment of FIG. 3, illustrating its operation.

Of the lines of magnetic force generated by the excited electromagnetic coils, two of those crossing at the magnetically neutral line on the perpendicular plane where the center axis exists also intersect the lateral wall surrounding the neutral line if the middle electro-magnetic coil is arranged outside as shown in FIG. 2. However, with the arrangement of the present invention, where the middle electromagnetic coil is arranged inside the vacuum chamber 1, the corresponding two lines of magnetic force do not intersect the lateral wall but are mutually connected to surround the electromagnetic coil 8 in the vacuum chamber 1 as shown in FIG. 4. In other words, the two lines of magnetic force surround the shown cross section of the conductor of the electromagnetic coil 8 and are mutually connected without intersecting or touching the lateral wall of the vacuum chamber 1 to reduce any loss of plasma and any damage to the lateral wall that can take place in the case of the arrangement of FIG. 2.

Figure 1:
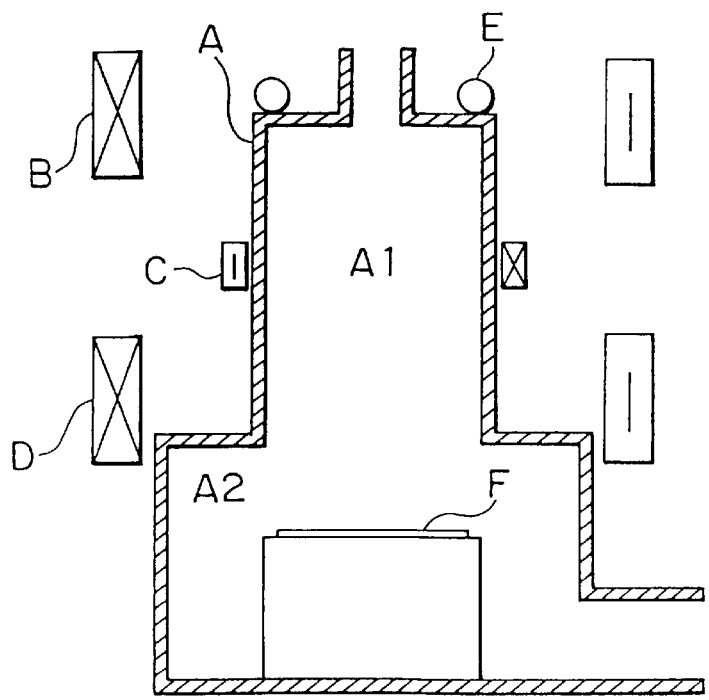
FIG. 1 is a schematic cross sectional view of a known discharge plasma processing apparatus previously proposed.

In an experiment where the arrangement of the present invention of FIG. 3 and the known arrangement of FIG. 1 were both used for $SiO_2$ sputtering, using Ar gas for the purpose of comparison. The lateral wall near the middle coil lost transparency and the etching rate fell to about 80% of the original level after 500 continuous sputtering operations in the case of FIG. 1, whereas the arrangement of the present invention did not show any such shortcomings.

Figure 5:
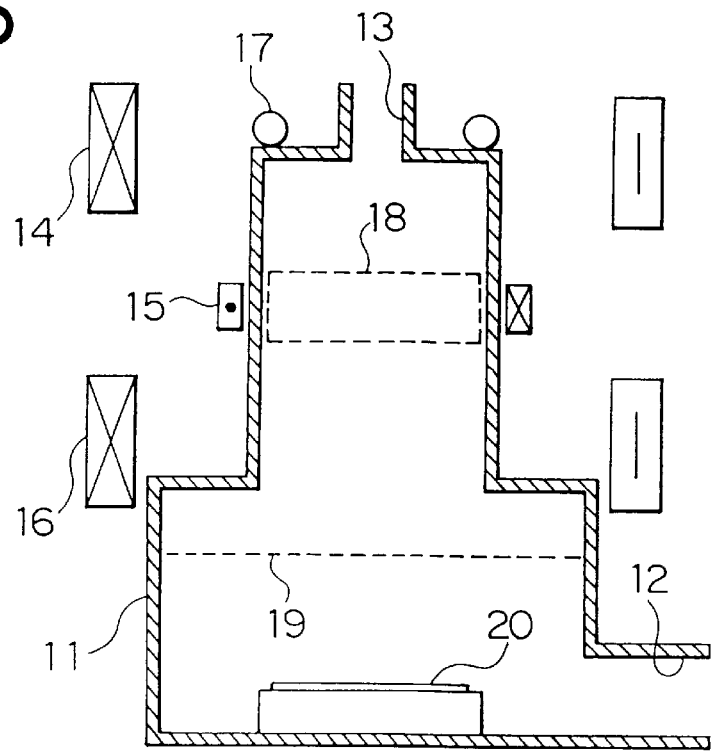
FIG. 5 is a schematic cross sectional view of another embodiment of the invention.

FIG. 5 illustrates a principal area of an embodiment of apparatus for utilizing magnetically neutral line discharge type plasma according to the invention. It comprises a dielectric vacuum chamber 11 provided with an exhaust port 12 disposed near the bottom and a gas inlet port 13 arranged at an upper portion thereof for introducing gas to be used in the vacuum chamber. Around and outside the peripheral wall of the dielectric vacuum chamber 11, there are arranged electromagnetic coils 14, 15 and 16 for forming a magnetically neutral line defined by continuously and spatially connecting points of zero-intensity magnetic field, of which the electromagnetic coils 14 and 16 have respective clockwise windings and the winding of the electromagnetic coil 15 is counterclockwise. Additionally, there are provided a high frequency coil 17 for generating plasma which is arranged on the top wall of the vacuum chamber 11, a strip-shaped circular electrode 18 for setting the plasma potential which is suspended from above at the level of the coil 15 and a net-shaped electrode 19 for drawing out a high speed ion flux arranged downstream relative to the plasma generating region. Reference numeral 20 denotes a calorimeter for measuring the momentum of the ion beam during the test.

Figure 6:
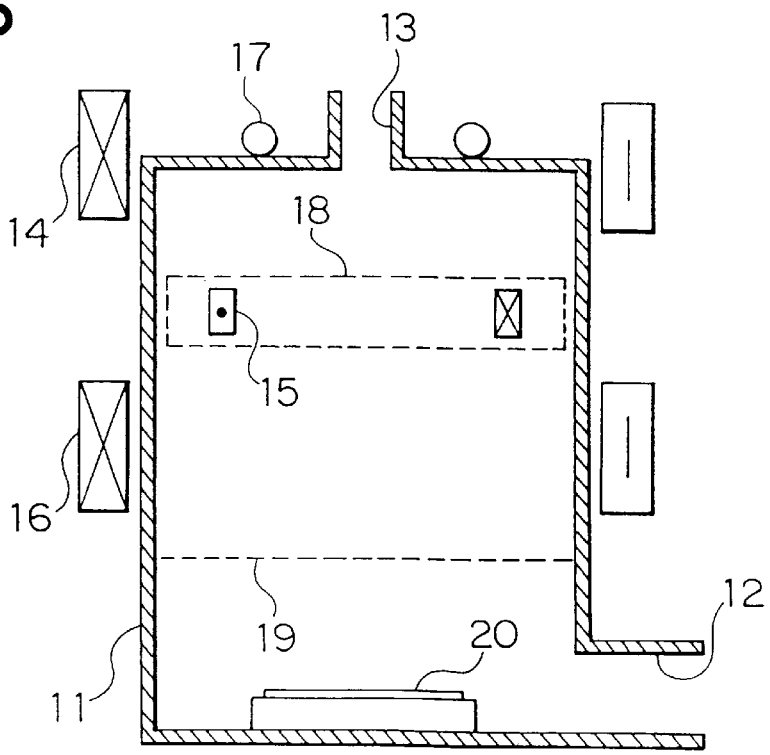
FIG. 6 is a schematic cross sectional view of a further embodiment of the invention.

FIG. 6 illustrates a principal area of another embodiment of apparatus for utilizing magnetically neutral line discharge type plasma according to the invention. The components similar to those of the embodiment shown in FIG. 5 are denoted respectively by the same reference numerals.

The embodiment of FIG. 6 differs from that of FIG. 5 in that the coil 15 is supported at three fulcrums in the vacuum chamber 11. On other constitution, it has a configuration same as that of the embodiment of FIG. 5.

With either embodiment, a constant current is made to flow through the upper and the lower coils 14 and 16 while a reversed directional constant current is made to flow through the middle coil 15 to produce a coaxial magnetically neutral loop inside the vacuum chamber 11 at the level of the middle coil 15. Then, NLD plasma is generated when a high frequency current of 13.56 MHZ is made to flow through the plasma generating high frequency coil 17. The generated NLD plasma is sufficiently thermalized by the high frequency current to show a Maxwell distribution and can be utilized for successfully carrying Out an $SiO_2$ sputter etching operation on the surface of Si wafers at high speed, using Ar gas, without causing any charge-up damage. Thus, it provides an etching effect far better than IPC etching under the same conditions.

The most remarkable matter about the generation of NLD plasma is that electrons are rather difficult to escape from the magnetically neutral line defined by continuously and spatially connecting points of zero-intensity magnetic field so that it is possible to reduce the flow rate of the introduced gas that is produced by the electric field applied along the magnetically neutral line and that a Maxwell distribution can be realized clearly by applying greater power to raise the intensity of the electric field and hence the processing efficiency particularly in terms of the etching rate of the processing operation can be increased. Thus, a uniform processing effect can be obtained on the entire surface (up to 1%/6 inches) even if the diameter of the magnetically neutral loop is held unchanged during the operation.

Figure 7:
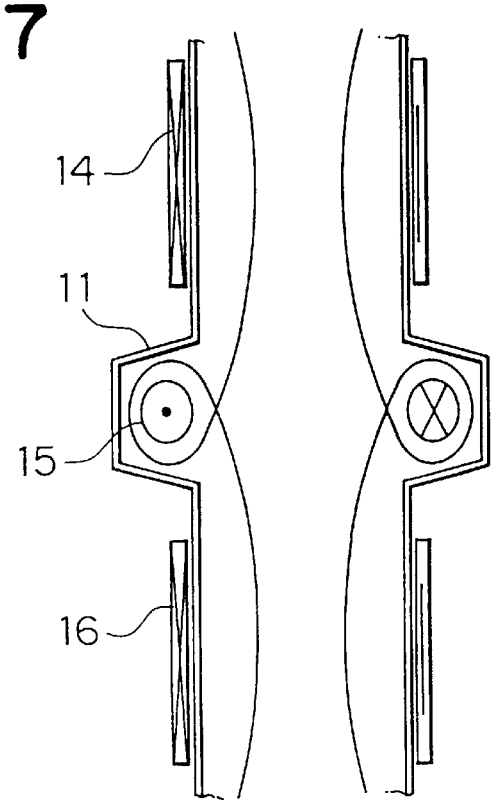
FIG. 7 is a schematic illustration showing the operation of an apparatus according to the invention.

The plasma potential can be controlled by utilizing the uniqueness of the above described NLD arrangement. In the case that three electromagnetic coils 14, 15 and 16 have same size and are disposed at suitable equal interval, FIG. 7 schematically shows the radial position of zero-intensity magnetic field points formed by flowing a clockwise current through the upper and lower coils 14 and 16 and simultaneously a counterclockwise current through the middle coil 15 and the line of magnetic force passing through the zero-intensity magnetic field points or separatrix. As shown in FIG. 7, the separatrix or the line of magnetic force comes from above, makes a single turn around the middle coil 15 and then heads for downward so that the fractions of the plasma generated at the zero-intensity magnetic field points (or X points) by the AC electric field applied perpendicularly relative to the surface of the drawing turn around the middle coil 15 and join immediately outside the middle coil 15 and are then dispersed up and down. This is the uniqueness of the NLD plasma.

Figure 8:
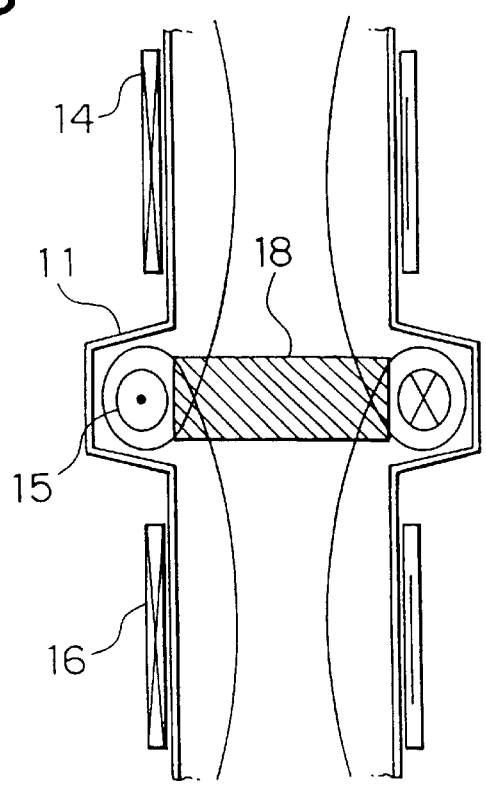
FIG. 8 is a schematic illustration also showing the operation of an apparatus according to the invention.
Figure 9:
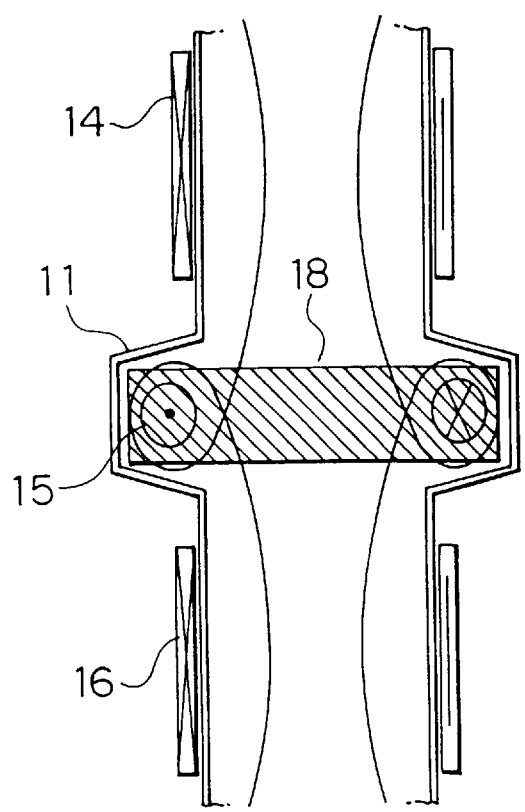
FIG. 9 is a schematic illustration also showing the operation of an apparatus according to the invention.

More specifically, with the arrangement of FIG. 7 where a strip-shaped circular, electrode 18 typically made of tungsten is placed inside (or outside) the middle coil 15 as shown in FIGS. 8 and 9, the NLD plasma is brought to contact with the strip-shaped circular electrode 18 at positions close to the zero-intensity magnetic field points or X points where the NLD plasma is generated so that the plasma potential is greatly influenced by the potential of the strip- shaped circular electrode 18. In other words, the plasma potential can be controlled by way of the potential of the strip-shaped circular electrode 18.

While the plasma generated at the zero-intensity magnetic field X points may partly cross lines of magnetic force, however, most of the plasma particles, particularly electrons that are much lighter than ions, move along separatrix lines of magnetic force at an enhanced speed. Thus, the dispersing plasma potential is apt to be determined by the contact with the strip-shaped circular electrode 18 as shown in FIGS. 8 and 9.

A high speed ion flux can be drawn out of the NLD plasma source typically arranging a circular and collar-shaped electrode or a circular network electrode 19 in a downstream region according to the known practice by controlling the potential of the circular and collar-shaped electrode or the circular network electrode 19 in synchronizing with the potential of the circular and strip-shaped electrode 18 located close to the X points as a function of the electric field intensity and the frequency of the AC electric field used for plasma generation.

In an experiment using the arrangement of FIG. 5 and that of FIG. 6, a negative voltage was applied to the network electrode 19 to see the relationship between the positive voltage applied to the circular and strip-shaped electrode 18 for setting the plasma potential and the momentum of the ion beam in terms of the reading of the calorimeter 20.

Helium gas was used to avoid unnecessary electric discharge between the electrode 18 and the electrode 19 and a relatively low voltage of several hundred volts was applied between the electrodes to find a rise in the reading of the calorimeter 20 that accompanied the rise in the voltage of the circular and strip-shaped electrode 18 for setting the plasma potential.

When the arrangement of FIG. 5 was compared with that of FIG. 6, the latter showed a higher value of the calorimeter under the same conditions to suggest a reduction in the rate of plasma colliding with the circular and strip-shaped electrode that was grounded away from the zero-intensity magnetic field points or X points.

Finally, a high speed neutral particle flux can be obtained by causing the high speed ion flux drawn out of NLD plasma to pass through a neutralizing chamber adapted to the type and the density of the ions. Such a neutralizing chamber may be arranged below the bottom of and in communication with the vacuum chamber 11 of any of the illustrated embodiments.

As described above, the apparatus for utilizing magnetically neutral line discharge type plasma according to the present invention comprises a magnetic field generating means for forming a magnetically neutral line defined by continuously and spatially connecting points of zero magnetic field intensity and an electric field generating means for generating plasma by applying an electric field along the magnetically neutral line to cause the gas therein to break down to electric discharge, the generated plasma being sufficiently thermalized to show a Maxwell distribution. Therefore, excessively accelerated electrons significantly departing from the Maxwell distribution can be suppressed in the plasma processing operation to avoid any charge-up damage.

Furthermore, a magnetically neutral line discharge type plasma source according to the invention comprises a magnetic field generating means for forming magnetically neutral lines defined by continuously connecting points of zero-intensity magnetic field that is partly arranged within the vacuum chamber so that the lines of magnetic force crossing at the magnetically neutral lines can be connected together by surrounding the magnetic field generating means without intersecting or touching the lateral wall of the vacuum chamber to reduce any possible loss of plasma and any possible damage to the lateral wall. Thus, the present invention provides a remarkable technological improvement for the utilization of magnetically neutral line discharge plasma that is indispensable for various semiconductor processing techniques involving the use of plasma such as sputtering or etching that is required to be free from impurities to an utmost degree. In other words, the present invention provides a magnetically neutral line discharge type plasma source that can minimize the damage to the lateral or peripheral wall and also the servicing workload.

NLD plasma is also needed from the viewpoint of generating plasma having a profile good for an appropriate distance from the object to be treated in addition to various desired characteristic aspects (temperature and density) so that the object to be treated may be processed not only two-dimensionally but also three-dimensionally.

Finally, a highly paralleled ion flux can be produced by means of NLD plasma having a particular directional arrangement for an etching operation to satisfy rigorous directional requirements. A high speed neutral particles flux can be prepared by neutralizing the ion flux got out of NLD plasma produced.

I claim:

1. An apparatus for utilizing magnetically neutral line discharge type plasma comprising a magnetic field generating means for forming a magnetically neutral line defined by continuously and spatially connecting points of zero-intensity magnetic field and an electric field generating means for generating plasma by applying an electric field along the magnetically neutral line to cause the gas therein to break down to electric discharge, the generated plasma being sufficiently thermalized to show a Maxwell distribution.

2. An apparatus according to claim 1, wherein the magnetic field generated by the magnetic field generating means is directed oppositely above and below the magnetically neutral line defined by spatially connecting points of zero-intensity magnetic field.

3. An apparatus for generating plasma by utilizing magnetically neutral line discharge in a vacuum chamber, comprising a magnetic field generating means for forming magnetically neutral lines defined by continuously connecting points of zero-intensity magnetic field within the vacuum chamber and an electric field generating means for causing the magnetically neutral line in the vacuum chamber to generate plasma by applying an electric field along the magnetically neutral lines, said magnetic field generating means being partly arranged within the vacuum chamber.

4. An apparatus according to claim 3, wherein the magnetic field generating means comprises a pair of magnetic field generating coils arranged outside the vacuum chamber with an interval therebetween and coaxial relative to each other and to the vacuum chamber and a third magnetic field generating coil arranged inside and coaxial relative to the vacuum chamber.

5. An apparatus according to claim 3, wherein the magnetic field generating means comprises a pair of hollow cylindrical magnets arranged outside the vacuum chamber with an interval therebetween and coaxial relative to each other and to the vacuum chamber.

6. An apparatus according to claim 3, wherein the magnetic field generating coil arranged inside and coaxial relative to the vacuum chamber comprises a coil that is superconductive at ordinary temperature.

7. An apparatus according to claim 3, wherein the electric field generating means comprises a high frequency coil.

8. An apparatus for generating plasma by utilizing magnetically neutral line discharge in a vacuum chamber, comprising a magnetic field generating means for forming magnetically neutral lines defined by continuously connecting points of zero-intensity magnetic field within the vacuum chamber and an electric field generating means for causing the magnetically neutral line in the vacuum chamber to generate plasma by applying an electric field along the magnetically neutral lines, said magnetic field generating means being partly arranged within the vacuum chamber, the electric field generating means being arranged at a level different from that of the magnetically neutral lines generated within the vacuum chamber by the magnetic field generating means arranged inside the vacuum chamber.

9. An apparatus according to claim 8, wherein said electric field generating means is arranged outside the vacuum chamber and above the plane of the magnetically neutral lines formed in the vacuum chamber when an object to be treated such as wafer is arranged below the magnetically neutral lines.

10. An apparatus for utilizing magnetically neutral line discharge type plasma comprising a magnetic field generating means for forming a magnetically neutral line defined by continuously and spatially connecting points of zero-intensity magnetic field, an electric field generating means for generating plasma by applying an electric field along the magnetically neutral line to cause the gas therein to break down to electric discharge, the generated plasma being sufficiently thermalized to show a Maxwell distribution, and an electrode means for generating a high speed ion flux by controlling the potential of the plasma having a Maxwell distribution.

11. An apparatus according to claim 10, wherein the magnetic field generated by the magnetic field generating means is directed oppositely above and below the magnetically neutral line defined by spatially connecting points of zero-intensity magnetic field.

12. An apparatus according to claim 10, wherein the electrode means comprises a plasma potential setting electrode for setting the potential of the generated plasma arranged in the vicinity of the formed magnetically neutral line.

13. An apparatus according to claim 10, wherein the electrode means comprises a high speed ion flux drawing electrode arranged downstream relative to the plasma generating region of the apparatus.

14. An apparatus for utilizing magnetically neutral line discharge type plasma comprising a magnetic field generating means for forming a magnetically neutral line defined by continuously and spatially connecting points of zero-intensity magnetic field, an electric field generating means for generating plasma by applying an electric field along the magnetically neutral line to cause the gas therein to break down to electric discharge, the generated plasma being sufficiently thermalized to show a Maxwell distribution, an electrode means for generating a high speed ion flux by controlling the potential of the plasma having a Maxwell distribution and a neutralizing chamber for producing a flux of high speed neutral particles by neutralizing the high speed ion flux from the electrode means arranged downstream relative to the electrode means.

\* \* \* \* \*